US010349176B1

(12) United States Patent
Yan

(10) Patent No.: US 10,349,176 B1
(45) Date of Patent: Jul. 9, 2019

(54) METHOD FOR PROCESSING SIGNALS, TERMINAL DEVICE, AND NON-TRANSITORY COMPUTER-READABLE STORAGE MEDIUM

(71) Applicant: Guangdong Oppo Mobile Telecommunications Corp., Ltd., Dongguan, Guangdong (CN)

(72) Inventor: Bixiang Yan, Guangdong (CN)

(73) Assignee: Guangdong Oppo Mobile Telecommunications Corp., Ltd., Dongguan (CN)

( * ) Notice: Subject to any disclaimer, the term of this patent is extended or adjusted under 35 U.S.C. 154(b) by 0 days.

(21) Appl. No.: 16/229,422

(22) Filed: Dec. 21, 2018

(30) Foreign Application Priority Data

Mar. 30, 2018 (CN) .......................... 2018 1 0291148

(51) Int. Cl.
*H03B 29/00* (2006.01)
*H04R 3/12* (2006.01)
(Continued)

(52) U.S. Cl.
CPC ......... *H04R 3/12* (2013.01); *G10K 11/17881* (2018.01); *H04R 1/1091* (2013.01); *G10K 2210/3012* (2013.01)

(58) Field of Classification Search
CPC ...................................................... H03B 29/00
See application file for complete search history.

(56) References Cited

U.S. PATENT DOCUMENTS 9,357,320 B2 * 5/2016 Gelter .................... H04R 29/00
9,830,930 B2 * 11/2017 Miller ..................... G10L 25/51
(Continued)

FOREIGN PATENT DOCUMENTS

CN 101790000 A 7/2010
CN 104158970 A 11/2014
(Continued)

OTHER PUBLICATIONS

International search report issued in corresponding international application No. PCT/CN2018/116743 dated Jan. 30, 2019.

*Primary Examiner* — Olisa Anwah
(74) *Attorney, Agent, or Firm* — Young Basile Hanlon & MacFarlane, P.C.

(57) ABSTRACT

A method for processing signals, a terminal device, and a non-transitory computer-readable storage medium are provided. The method includes the following. When a user talks through the headphone, a first sound signal of external environment and a second sound signal of a talking party are alternately recorded with a headphone. A third sound signal of external environment is obtained, by eliminating voices in the first sound signal according to the second sound signal. Feature audio in the third sound signal of external environment is identified and reminding information corresponding to the feature audio is acquired. Inquire of the user whether the third sound signal is critical according to the reminding information, when the talk ends. An input operation of the user is detected and the third sound signal is processed according to the input operation of the user.

20 Claims, 6 Drawing Sheets

(51) Int. Cl.

| | |
|---|---|
| ***G10K 11/178*** | (2006.01) |
| ***H04R 1/10*** | (2006.01) |

(56) References Cited

U.S. PATENT DOCUMENTS

| | | | | |
|---|---|---|---|---|
| 10,074,355 | B2 * | 9/2018 | Goldman | H04R 1/1041 |
| 10,129,633 | B1 * | 11/2018 | Patil | H04R 1/1083 |
| 2007/0189544 | A1 * | 8/2007 | Rosenberg | G11B 27/105 381/57 |
| 2008/0187163 | A1 * | 8/2008 | Goldstein | H04R 25/70 381/380 |
| 2008/0253583 | A1 * | 10/2008 | Goldstein | H04R 1/1091 381/92 |
| 2009/0232325 | A1 * | 9/2009 | Lundquist | H03G 3/32 381/74 |
| 2013/0158691 | A1 * | 6/2013 | Aldaz | H04R 1/1091 700/94 |
| 2014/0185828 | A1 * | 7/2014 | Helbling | H03G 5/165 381/103 |
| 2015/0222977 | A1 * | 8/2015 | Angel, Jr. | H04R 1/105 381/74 |
| 2017/0026610 | A1 | 1/2017 | Kwon et al. | |
| 2017/0099538 | A1 * | 4/2017 | Kraft | H04R 1/1016 |
| 2018/0336901 | A1 * | 11/2018 | Masaki | G10L 15/265 |

FOREIGN PATENT DOCUMENTS

| | | | |
|---|---|---|---|
| CN | 105635872 | A | 6/2016 |
| CN | 108391206 | A | 8/2018 |
| CN | 108540661 | A | 9/2018 |
| CN | 108600885 | A | 9/2018 |

* cited by examiner

METHOD FOR PROCESSING SIGNALS, TERMINAL DEVICE, AND NON-TRANSITORY COMPUTER-READABLE STORAGE MEDIUM

CROSS-REFERENCE TO RELATED APPLICATION(S)

This application claims priority to and the benefit of Chinese Application Patent Serial No. 201810291148.3, filed on Mar. 30, 2018, the entire disclosure of which is hereby incorporated by reference.

TECHNICAL FIELD

This disclosure relates to the technical field of communication, and more particularly to a method for processing signals, a terminal device, and a non-transitory computer-readable storage medium.

BACKGROUND

With the intelligent development of communication devices, people use smart terminal devices more and more frequently in daily lives, and a variety of activities such as video chatting, calls, voice communication, music, video playback, and the like can be conducted with the smart terminal device. As a tool for transmitting sound, headphones bring better listening experience to the people and are widely used in people's daily lives. A user can use the headphone to listen to music, make calls, conduct voice or video communication, and play video. In more and more occasions, people like to wear headphones. Furthermore, the effects of sound insulation and noise reduction of the headphones are getting better and better.

When a user wears a headphone to listen to sound played by a terminal device, hearing of the user, which can assist visual sense, is greatly restricted by the sound played by the headphone. The user is hard to notice sound signals of external environment, which may cause missing some important information such as contents of other's speech. Therefore, the user may have to take off the headphone or pause the headphone to receive external sound, which may affect the user experience.

SUMMARY

A method for processing signals, a terminal device, and a non-transitory computer-readable storage medium are provided.

A method for processing signals is provided. The method includes the following. When a user talks through the headphone, a first sound signal of external environment and a second sound signal of a talking party are alternately recorded with a headphone. A third sound signal of external environment is obtained, by eliminating voices in the first sound signal according to the second sound signal. Feature audio in the third sound signal of external environment is identified and reminding information (in other word, prompt information) corresponding to the feature audio is acquired. Inquire of the user whether current recorded content is critical according to the reminding information, when the talk ends. An input operation of the user is detected and the third sound signal of external environment is processed according to the input operation of the user.

A terminal device is provided. The terminal device includes at least one processor and a computer readable storage. The computer readable storage is coupled to the at least one processor and configured to store at least one computer executable instruction thereon which, when executed by the at least one processor, cause the at least one processor to carry out actions, including: recording alternately a first sound signal of external environment and a second sound signal of a talking party when a user talks through the headphone; obtaining a third sound signal of external environment, by eliminating voices in the first sound signal according to the second sound signal; identifying feature audio in the third sound signal of external environment and acquiring reminding information corresponding to the feature audio; inquiring of the user whether the third sound signal of external environment is critical according to the reminding information, when the talk ends; detecting an input operation of the user and processing the third sound signal of external environment according to the input operation of the user.

A non-transitory computer-readable storage medium is provided. The non-transitory computer-readable storage medium is configured to store a computer program which, when executed by a processor, causes the processor to carry out actions: recording alternately a first sound signal of external environment and a second sound signal of a talking party when a user talks through the headphone; obtaining a third sound signal of external environment, by eliminating voices in the first sound signal according to the second sound signal; identifying feature audio in the third sound signal of external environment and acquiring reminding information corresponding to the feature audio; inquiring of the user whether the third sound signal of external environment is critical according to the reminding information, when the talk ends; detecting an input operation of the user and processing the third sound signal of external environment according to the input operation of the user.

BRIEF DESCRIPTION OF THE DRAWINGS

To illustrate the technical solutions embodied by the implementations of the present disclosure more clearly, the following briefly introduces the accompanying drawings required for describing the implementations or the related art. Apparently, the accompanying drawings in the following description merely illustrate some implementations of the present disclosure. Those of ordinary skill in the art may also obtain other drawings based on these accompanying drawings without creative efforts.

DETAILED DESCRIPTION

To illustrate objectives, technical solutions, and advantageous effects of the disclosure more clearly, the specific implementations of the present disclosure will be described in detail herein with reference to accompanying drawings. It will be appreciated that the implementations are described herein for the purpose of explaining the disclosure rather than limiting the disclosure.

All technical and scientific terms used herein have the same meaning as commonly understood by those of ordinary skill in the art to which this disclosure applies, unless otherwise defined. The terms used herein are for the purpose of describing particular implementations only, and not intended to limit the disclosure. It will be understood that the terms "first", "second", and the like, as used herein, may be used to describe various elements, but these elements are not limited by these terms. These terms are only used to distinguish one element from another. For example, the first application may be referred to as a second application without departing from the scope of the present application, and similarly, the second incoming application may be the first application. Both the first application and the second application are applications, but they are not the same application.

Figure 1:
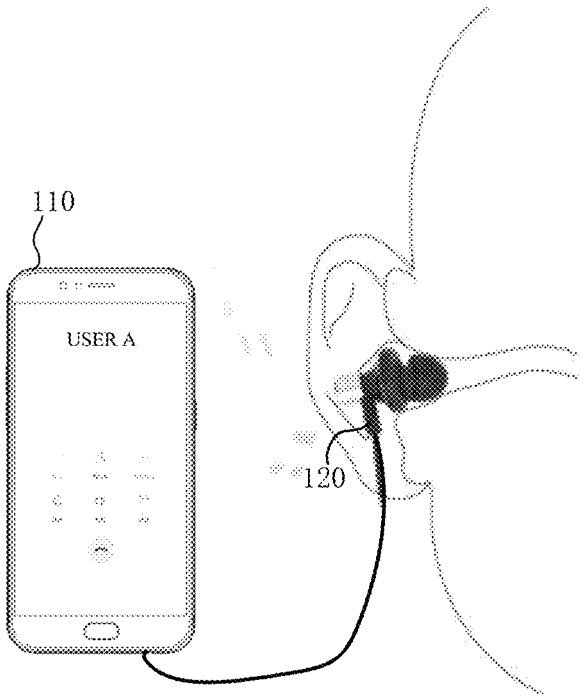
FIG. 1 is a schematic diagram illustrating an application scenario of a method for processing signals according to an implementation of the present disclosure.

FIG. 1 is a schematic diagram illustrating an application scenario of a method for processing signals according to an implementation of the present disclosure. As illustrated in FIG. 1, the application scenario relates to a terminal device 110 and a headphone 120 in communication with the terminal device 110.

The terminal device 110 can communicate with the headphone 120. The headphone 120 includes, but is not limited to, an in-ear headphone and an earplug headphone. The terminal device 110 and the headphone 120 can conduct wired or wireless communication to realize data transmission.

The terminal device 110 may play audio signals, which may be signals of music, video sound, calling sound, or the like. The audio signal played by the terminal device 110 is transmitted to a user's ear through the headphone 120, so that the user can hear the sound. On the other hand, the headphone 120 can also collect audio signals, which may be signals of user's voice, sound of external environment, or the like. The audio signal collected by the headphone 120 is transmitted to the terminal device 110 for processing and can be used for voice communication, sound instruction, audio noise reduction, and the like.

The headphone 120 includes an electroacoustic transducer. As one implementation, the electroacoustic transducer includes a second microphone, a first speaker (that is a left speaker), and a second speaker (that is a right speaker), where the first speaker or the second speaker are disposed at a tip portion of the headphone 120. When the tip portion of the headphone 120 is placed in an ear canal of the user, the first speaker or the second speaker can output the audio signal played by the terminal device 110 into the ear canal of the user. As one implementation, the electroacoustic transducer includes the second microphone, a first microphone, the first speaker, and the second speaker. The first speaker and the second speaker are configured to play the audio signal sent by the terminal device 110. The second microphone is configured to record an audio signal around the headphone 120 (mainly a voice signal from the user). The first microphone is configured to record an audio signal around the headphone 120. As one implementation, at least one of the first speaker and the second speaker is integrated with the first microphone.

Figure 2:
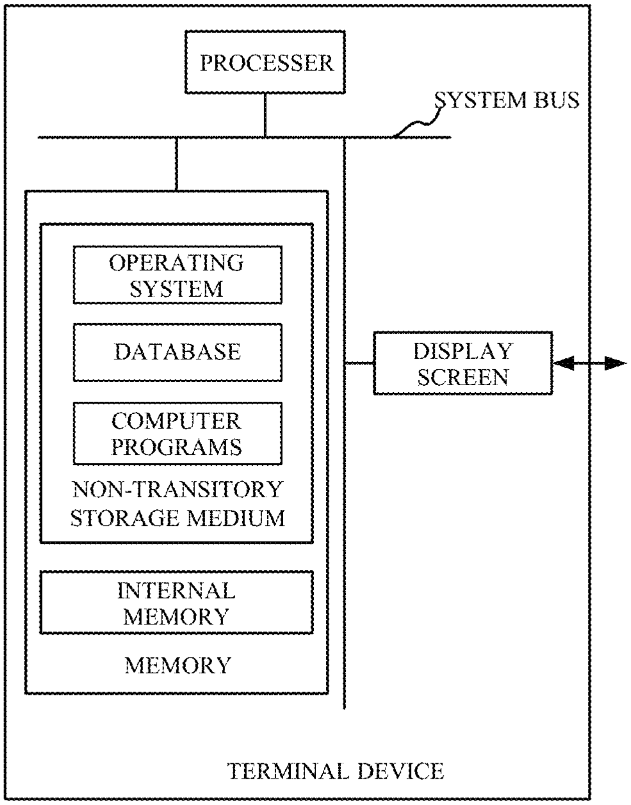
FIG. 2 is a schematic structural diagram illustrating an inner structure of a terminal device according to an implementation of the present disclosure.

FIG. 2 is a schematic structural diagram illustrating an inner structure of a terminal device according to an implementation. The terminal device 110 includes a processor, a memory, and a display screen which are coupled via a system bus. The processor is configured to provide computing and control capabilities to support operations of the entire terminal device 110. The memory is configured to store data, programs, and/or instruction codes. The memory stores at least one computer program which, when executed by the processor, is operable with the processor to perform a method for processing signals applicable to the terminal device 110 according to implementations of the present disclosure. The memory may include a non-transitory storage medium such as a magnetic disk, an optical disk, and a read-only memory (ROM), or may include a random access memory (RAM). As one implementation, the memory includes a non-transitory storage medium and an internal memory. The non-transitory storage medium is configured to store an operating system, a database, and computer programs. Data associated with the method for processing signals according to implementations of the disclosure are stored in the database. The computer programs can be executed by the processor to implement the method for processing signals according to the implementations of the present disclosure. The internal memory provides a cache execution environment for the operating system, the database, and the computer programs of the non-transitory storage medium. The display screen may be a touch screen such as a capacitive touch screen and a resistive touch screen, and is configured to display interface information of the terminal device 110. The display screen can be operable in a screen-on state or a screen-off state. The terminal device 110 may be a mobile phone, a tablet computer, a personal digital assistant (PDA), a wearable device, and the like.

Those skilled in the art can understand that the structure illustrated in FIG. 2 is only a partial structure related to the technical solutions of the present disclosure, and does not constitute any limitation on the terminal device 110 to which the technical solutions of the present disclosure can be applied. The terminal device 110 may include more or fewer components than illustrated in the figure or be provided with different components, or certain components can be combined.

Figure 3:
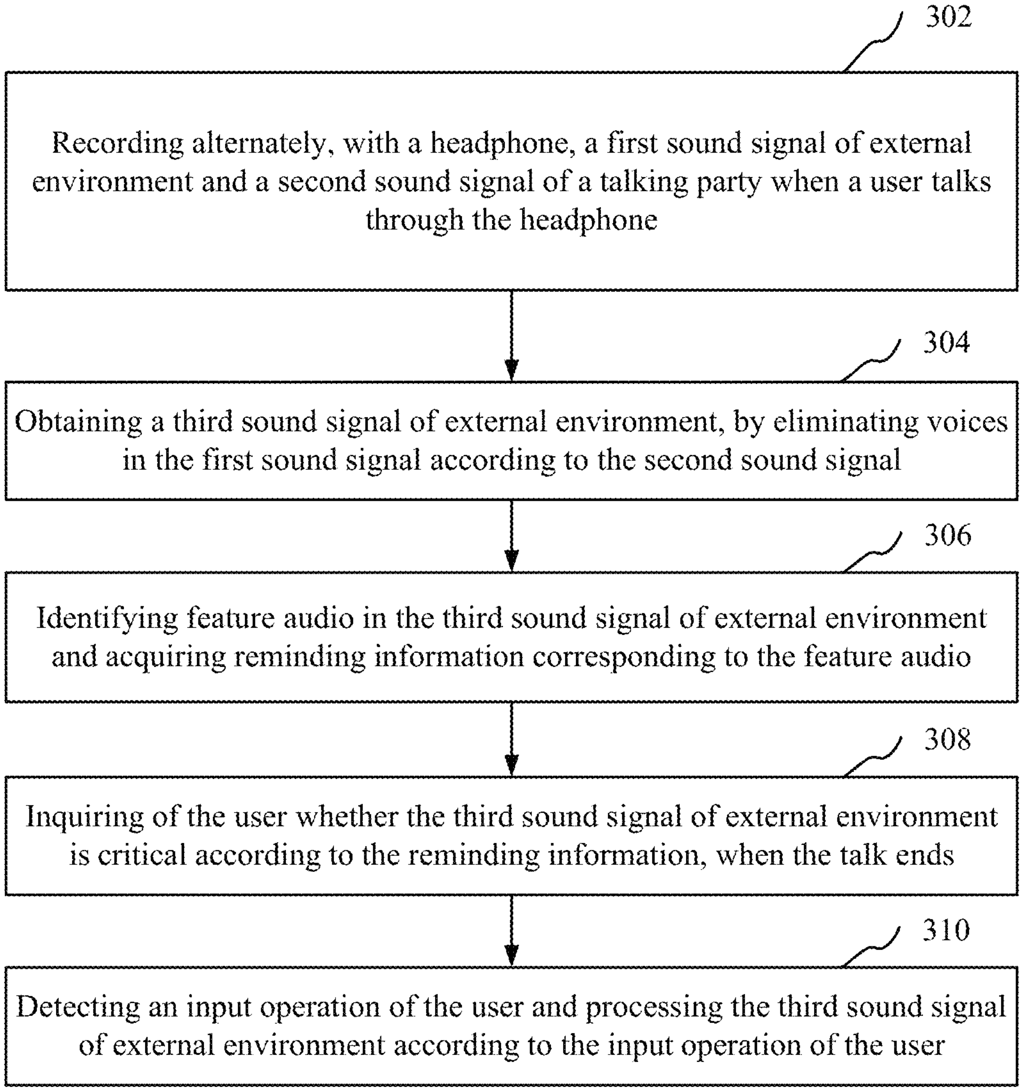
FIG. 3 is a schematic flow chart illustrating a method for processing signals according to an implementation of the present disclosure.

FIG. 3 is a schematic flow chart illustrating a method for processing signals according to an implementation of the present disclosure. The method of the implementation for example is implemented on the terminal device or the headphone illustrated in FIG. 1. The method begins at block 302.

At block 302, when a user talks through the headphone, a first sound signal of external environment and a second sound signal of a talking party are alternately recorded with a headphone.

The headphone can conduct wired or wireless communication with the terminal device. When the user talks through the headphone, the terminal device can transmit an audio signal of the talking party to the headphone, and then send a sound to a user's ear through a speaker of the headphone. On the other hand, the terminal device can collect a voice of the user with a microphone of the headphone and transmit the voice of the user to the talking party. The headphone includes an electroacoustic transducer. As one implementation, the electroacoustic transducer includes a first speaker, a second speaker, and a second microphone. When the user talks through the headphone, a voice signal of the user is collected with the second microphone of the headphone, and the first sound signal of the external environment and the second sound signal of the talking party are alternately recorded with at least one of the first speaker and second speaker of the headphone configured to play an audio signal. The first sound signal represents an external environment sound, the talking party refers to a person with whom the user communicates, and the second sound signal represents a voice of the talking party.

Generally, the second microphone of the headphone is placed close to the user's lips, such that it is easy to collect a voice signal from the user. When the user talks through the headphone, since the second microphone of the headphone is occupied and cannot obtain the external environment sound, the at least one of the first speaker and second speaker is configured to alternately record the first sound signal of the external environment and the second sound signal of the talking party.

Each of the first speaker and the second speaker is configured to convert an electrical signal corresponding to the audio signal into an acoustic wave signal that the user can hear. In addition, each of the first speaker and the second speaker is very sensitive to acoustic waves. The acoustic waves can cause vibration of a speaker cone and drive a coil coupled with the speaker cone to cut magnetic field lines in a magnetic field of a permanent magnet, thus generating a current that varies with the acoustic waves (a phenomenon of generating the current is called an electromagnetic induction phenomenon in physics). Accordingly, an electromotive force corresponding to the audio signal will be output at two ends of the coil, and therefore, each of the first speaker and the second speaker can collect and record the sound signal of the external environment. That is, any one of the first speaker and the second speaker can be used as a microphone to recording sound signals.

Although different in types, functions, and operation states, any one of the first speaker and the second speaker includes two basic components, that is, an electrical system and a mechanical vibration system. Inside the first speaker and the second speaker, the electrical system and the mechanical vibration system are coupled to each other through some physical effect to enable energy conversion.

The first sound signal of the external environment and the second sound signal of the talking party are alternately recorded with at least one of the first speaker and the second speaker of the headphone configured to play an audio signal. That is, at least one of the first speaker and the second speaker of the headphone can record sound signals alternately, where alternately recording can be achieved by switching between recording of the first sound signal and recording of the second sound signal according to a recoding period. As one implementation, in order to facilitate the continuity of signals, a time-division switching manner can be adopted. The "time-division switching" herein refers to realizing sound signal switching between different signal transmission paths by dividing a time period into multiple time slots which are not overlapped with each other, establishing different sub-channels for different time slots, and completing time slot switching of the sound signals through a time slot switching network. As an implementation, when the recording period is preset to be 5 ms, recording of sound signals is switched every 5 ms. For example, the first sound signal is recorded within the first 5 ms and the second sound signal is recorded within the second 5 ms, thereby achieving alternative recording of the first sound signal and the second sound signal. As an implementation, the first sound signal may be generated by a speaker, audio equipment, or a generator, or may be talking voices of a person, which is not limited herein.

At block 304, a third sound signal of external environment is obtained, by eliminating voices in the first sound signal according to the second sound signal.

The third sound signal of external environment (that is an external environment sound) is obtained by eliminating the voices in the first sound signal according to the second sound signal. As one implementation, the first sound signal can be filtered according to the second sound signal. That is, a filter waveform with a phase contrary to that of the second sound signal is generated and then added to the first sound signal, so as to eliminate the voices in the first sound signal. In this way, interference of the voices of the talking party can be removed, and a third sound signal containing only the external environment sound can be obtained.

At block 306, feature audio in the third sound signal of external environment is identified and reminding information corresponding to the feature audio is acquired.

The feature audio includes, but is not limited to, "person feature audio", "time feature audio", "location feature audio", and "event feature audio". As an implementation, "person feature audio" may be an audio signal including a name and a nickname of a person or a company that the user pays attention to. "Time feature audio" may be an audio signal including numbers and/or dates. "Location feature audio" may refer to information of user's country, city, company, and home address. "Event feature audio" may be special alert audio including a siren and a cry for help for example.

For example, assume that user A stores an audio of the user's name "A" and "B" as feature audio. When a person says "A" or "B" and a similarity between the feature audio stored and what the person said reaches a preset level, it is determined that the third sound signal contains the feature audio. When the third sound signal contains the feature audio, the reminding information corresponding to the feature audio is acquired.

The reminding information may include first reminding information and second reminding information. The first reminding information is presented by the headphone, which means that a certain recording is played through the headphone to be transmitted to the user's ear so as to remind the user. The second reminding information is presented by the terminal device in communication with the headphone, where the terminal device may conduct reminding through interface display, a combination of the interface display and ringtone, a combination of interface display and vibration, or the like. All other reminding manners that can be expected by those skilled in the art shall fall within the protection scope of the present disclosure.

At block 308, inquire of the user whether the third sound signal of external environment is critical according to the reminding information, when the talk ends.

The expression of "when the talk ends" means that one of two talking parties hangs up and the terminal device is no longer in a talk-state. When the talk ends, the user no longer needs to listen to voices with the headphone. At this time, inquire of the user whether the third sound signal of external environment (that is current recorded content) is critical according to the reminding information. For instance, when the third sound signal of external environment contains "person feature audio", the user may be reminded "someone just mentioned you, do you want to listen to the recoding" when the talk ends. In this way, the third sound signal can be presented to the user, and the user may quickly determine whether the third sound signal is critical, thus avoiding missing important information.

At block 310, an input operation of the user is detected and the third sound signal is processed according to the input operation of the user.

The input operation may be received on the headphone or on the terminal device. When the input operation is received on the headphone, the input operation may be operated on a physical key of the headphone or on a housing of the headphone. When the input operation is received on the terminal device, the input operation may include, but is not limited to, a touch operation, a press operation, a gesture operation, a voice operation, and the like. As one implementation, the input operation can also be implemented by other control devices, such as a smart bracelet or a smart watch, which is not limited herein.

Furthermore, when the input operation of the user is detected, whether to play the third sound signal is determined according to the input operation. When the input operation indicates that the user wants to play the third sound signal, then play the third sound signal. When the input operation indicates that the user does not want to play the third sound signal, then delete a stored audio file corresponding to the third sound signal to save storage space.

According to the method of the disclosure, the external environment sound can be recorded with inherent components of the headphone, the user can take into account both headphone playing and external sound acquisition and can be reminded according to the recorded content, so that the user will not miss important information when he or she wears the headphone, thus improving convenience of using the headphone and further enhancing use experience.

As one implementation, besides the first speaker, the second speaker, and the second microphone, the headphone is further provided with a first microphone close to at least one the first speaker and the second speaker of the headphone.

Record alternately, with the headphone, the first sound signal of external environment and the second sound signal of the talking party when the user talks through the headphone as one of the following.

Record alternately, with at least one speaker of the headphone configured to play an audio signal, the first sound signal of the external environment and the second sound signal of the talking party, when the user talks through the headphone; record alternately, with the first microphone close to at least one speaker of the headphone, the first sound signal of the external environment and the second sound signal of the talking party.

Generally, the second microphone of the headphone is placed close to the user's lips, such that it is easy to collect the voice signal from the user. When the user talks through the headphone, since the second microphone of the headphone is occupied and cannot obtain the external environment sound, in this case, the first microphone of the headphone is configured to record the first sound signal of the external environment and the second sound signal of the talking party. The user is reminded according to the first sound signal recorded by the second microphone.

Figure 4:
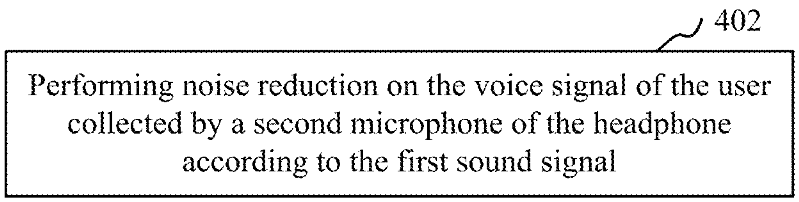
FIG. 4 is a schematic flow chart illustrating a method for processing signals according to another implementation of the present disclosure.

As illustrated in FIG. 4, the method further includes the following at block 402.

At block 402, noise reduction is performed on the voice signal of the user collected by the second microphone of the headphone according to the first sound signal.

Noise reduction can be performed on the voice signal of the user collected by the second microphone of the headphone according to the first sound signal recorded by the first microphone, so as to eliminate environment noise in the voice signal collected by the second microphone of the headphone. In this way, the second microphone of the headphone can record and transmit the user's voice to the talking party more clearly, thereby improving the voice quality during a talk.

Figure 5:
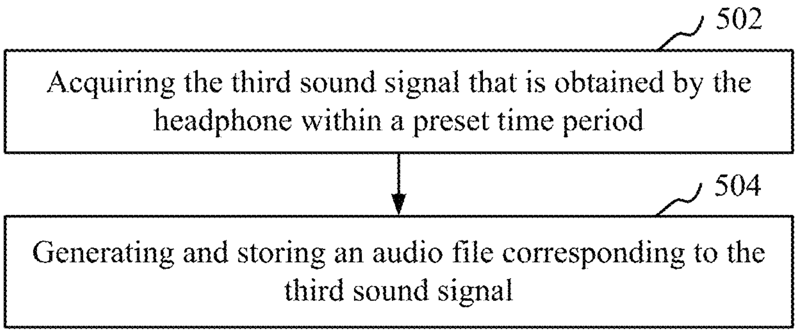
FIG. 5 is a schematic flow chart illustrating a method for processing signals according to yet another implementation of the present disclosure.

As one implementation, as illustrated in FIG. 5, the method includes the following.

At block 502, the third sound signal of external environment that is obtained by the headphone within a preset time period is acquired.

As one implementation, the preset time period may be determined according to the duration of a talk. In addition, an audio signal can be recorded in sections according to the preset time period. Since the user generally only wants to know external situation in a recent time period, multiple audio sound signals can be recorded within the preset time period for the user to choose. For example, when each time period of recording the first sound signal is set to be one minute, the headphone may start a new recording every one minute, and stores the first sound signal recorded last time period. It should be noted that, the preset time period can be set according to a user requirement, and implementations of the disclosure are not limited thereto herein.

At block 504, an audio file corresponding to the third sound signal of external environment is generated and stored.

As one implementation, the audio file corresponding to the third sound signal of external environment (that is a filtered first sound signal recorded) is generated and stored in a preset storage path. In another implementation, the number of audio files stored can be preset, and an oldest audio file may be overwritten with a newly generated audio file through an update-and-iterative process. Because of the real-time nature of information, an audio file that the user has listened to can be deleted to avoid occupying system memory. In this way, the storage space can be effectively saved.

Figure 6:
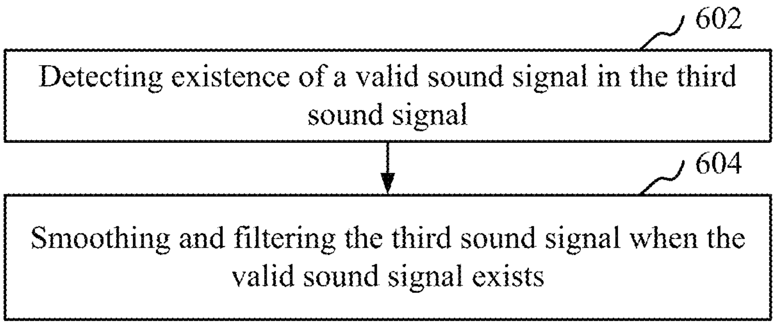
FIG. 6 is a schematic flow chart illustrating a method for processing signals according to still another implementation of the present disclosure.

As one implementation, as illustrated in FIG. 6, the method further includes the following at blocks 602 to 604 prior to identifying feature audio in the first sound signal.

At block 602, detect existence of a valid sound signal in the third sound signal of external environment.

The third sound signal of external environment recorded may contain noise components because of ambient noise. It is necessary to distinguish the valid sound signal from the third sound signal to avoid an influence of noise on estimation of time delay.

A "short-time zero-crossing rate" refers to the number of times of abnormal values appearing in waveform acquisition values in a certain frame of a sound signal. In a valid sound signal segment, the short-time zero-crossing rate is low, while in a noise signal segment or a silence signal segment, the short-time zero-crossing rate is relatively high. By detecting the short-time zero-crossing rate, whether the first sound signal contains the valid sound signal can be determined.

As one implementation, whether the first sound signal contains the valid sound signal can also be determined through short-time energy detection.

At block 604, the third sound signal of external environment is smoothed and filtered when the valid sound signal exists.

When the third sound signal contains the valid sound signal, the third sound signal may be smoothed by windowing and framing. "Framing" is to divide the first sound signal into multiple frames according to a same time period, so that each frame becomes more stable. "Windowing and framing" is to weight each frame of the third sound signal by a window function. Here, we use a Hamming window function with lower sidelobe level for example.

In addition, frequency of the noise signal may be distributed throughout the frequency space. "Filtering" refers to a process of filtering signals of a specific frequency band in the third sound signal, so as to preserve signals in the specific frequency band and attenuate signals in other frequency bands. The smoothed sound signal can be clearer after filtering.

Figure 7:
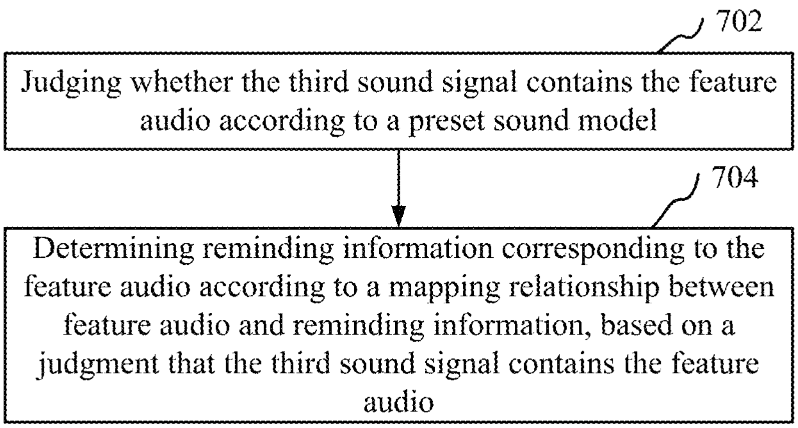
FIG. 7 is a schematic flow chart illustrating a method for processing signals according to still another implementation of the present disclosure.

As one implementation, as illustrated in FIG. 7, identifying feature audio in the first sound signal and acquiring reminding information corresponding to the feature audio is as follows.

At block 702, judge whether the third sound signal contains the feature audio according to a preset sound model.

The preset sound model refers to sound signals with specific frequencies. The preset sound model includes, but is not limited to, "noise feature model", "person feature model", "time feature model", "location feature model", and "event feature model". The preset sound model is stored in a database and can be invoked and matched when necessary. As one implementation, the preset sound model can be added, deleted, and modified according to user's habit, so as to meet the needs of different users.

As one implementation, "noise feature model" may include sound the user should pay attention to, such as speaker sound, alarm sound, knocking sound, a cry for help, and the like. "Person feature model" may be an audio signal including a name and a nickname of a person or a company that the user pays attention to. "Time feature model" may be an audio signal including numbers and/or dates. "Location feature model" may be an audio signal including user's country, city, company, and home address.

Furthermore, when the third sound signal contains the valid sound signal, analyze the valid sound signal to see whether the third sound signal contains the feature audio. In particular, the feature audio in the third sound signal is identified, and whether the feature audio is matched with a preset sound model is determined. The identification process can be conducted as at least one of the follows. Noise information in the third sound signal is extracted, and whether the noise information is matched with a preset noise feature model is determined; voiceprint information of the first sound signal is extracted, and whether the voiceprint information is matched with sample voiceprint information is determined; sensitive information of the first sound signal is extracted, and whether the sensitive information is matched with a preset key word is determined.

As an example, when it is identified that the first sound signal contains the speaker sound, the feature audio in the first sound signal is determined to be matched with the preset sound model. As another example, if user A stores the audio of the user's name "A" and "B" as feature audio (both A and B refer to name of the user A), when a person says "A" or "B" and a similarity between the feature audio stored and what the person said reaches a preset level, the first sound signal of the external environment is determined to contain the feature audio.

At block 704, reminding information corresponding to the feature audio is determined according to a corresponding relationship between feature audio and reminding information, based on a judgment that the first sound signal contains the feature audio.

The reminding information is acquired by summarizing content of the feature audio, and is configured to prompt the user to pay attention to important content in the first sound signal. Different feature audio may correspond to different reminding information, or the reminding information may be customized according to input content of the user. For example, if user A stores the audio of the user's name "A" and "B" as feature audio, when it is identified that the first sound signal contains the feature audio, the corresponding reminding information "someone just mentioned you" may be presented, to remind the user to pay attention to content recorded by the headphone. It should be noted that the reminding information may be transmitted to the user in the manner of playing through the headphone, or may be transmitted to the user as a prompt message on the display screen of the terminal device, or may be viewed by the user through other display means, which is not limited herein.

Furthermore, the feature audio includes, but is not limited to, "person feature audio", "time feature audio", "location feature audio", and "event feature audio". As one implementation, the reminding information may be set according to preset priorities of the feature audio. The feature audio is sorted as follows in descending order of priorities: event feature audio—a name or a nickname of the user in the person feature audio—a name or a nickname of a person or a company that the user pays attention to in the person feature audio—time feature audio—location feature audio. Different feature audio may correspond to different reminding information. The reminding information corresponding to the feature audio can be determined according to the corresponding relationship between the feature audio and the reminding information.

Figure 8:
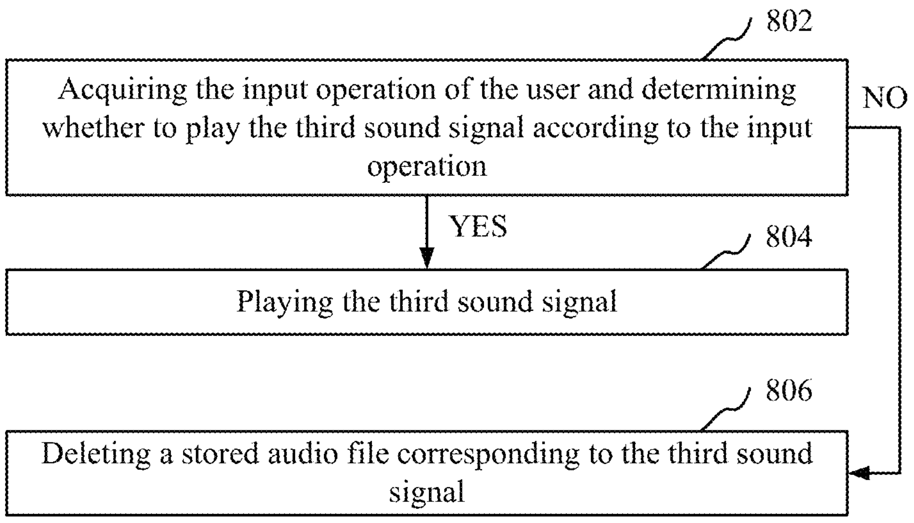
FIG. 8 is a schematic flow chart illustrating a method for processing signals according to still another implementation of the present disclosure.

As one implementation, as illustrated in FIG. 8, detecting an input operation of the user and processing the first sound signal according to the input operation of the user is as follows.

At block 802, the input operation of the user on the headphone is acquired and whether to play the third sound signal is determined according to the input operation.

As one implementation, the input operation may be any operation such as tapping, pressing, or the like performed by the user at any position on the headphone housing. The at least one of the first speaker and the second speaker for playing an audio signal can acquire a sound signal generated by the tapping, pressing, or the like, and the sound signal can be taken as a vibration signal. Since the tapping or the pressing is of short duration and the vibration signal is transmitted through a solid, the vibration signal generated by the tapping or the pressing is different from a vibration signal generated by other forces or a vibration signal generated by an external vibration source transmitted through the headphone. Therefore, the input operation of the user can be detected by analyzing the vibration signal the headphone acquires.

As one implementation, a leak port for balancing air pressure can be disposed on the headphone. When an input operation of the user on the leak port of the headphone is received, a frequency-response curve related to an acoustic structure of the headphone can be acquired according to an audio signal currently played by the headphone, and the input operation of the user can be identified according to different frequency-response curves. For example, when the user uses the headphone to listen to music, watch videos, answer a call, and the like, the user may perform an input operation such as covering, plugging, pressing, and the like on the leak port of the headphone. The input operation includes covering the leak port on the earphone housing at a preset position, within a preset time period, with a preset frequency, and the like. Whether to play the first sound signal can be determined according to different input operations. The method proceeds to operations at block 804 based on a determination that the third sound signal is to be played; otherwise, proceed to operations at block 806 based on a determination that the first sound signal is not to be played.

At block 804, the third sound signal is played.

As one implementation, the method further includes the following.

Geographic location information of the first sound signal is acquired by the headphone.

The operations at block 804 can be conducted as follows.

A target audio file is generated according to the third sound signal and the geographic location information of the first sound signal, and the target audio file is played.

When the headphone is in a playing state, current geographic location information of the terminal device in communication with the headphone can be acquired. The current geographic location information of the terminal device can be taken as geographic location information of the headphone. The geographic location information of the headphone can be acquired by a built-in global positioning system (GPS) of the terminal device. Location information of the first sound signal can be acquired by multiple microphones of the headphone. As one implementation, the first speaker and the second speaker on the headphone can record the first sound signal as a microphone. According to time delays of receiving the first sound signal by the first microphone of the headphone, the first speaker, and the second speaker of the headphone, the location information of the first sound signal relative to the headphone can be acquired.

Furthermore, according to the geographic location information of the headphone and the location information of the first sound signal relative to the headphone, the geographic location information of the first sound signal can be acquired.

The acquired first sound signal is bound to the geographical location information of the first sound signal to generate the target audio file. Furthermore, the target audio file can also carry time information of collecting the first sound signal, so that location information and the time information of the target audio file can be acquired in time, and the third sound signal (that is the filtered first sound signal) can be more richly displayed.

In response to a play instruction being received, play the target audio file, where the target audio file contains the geographic location information of collecting the first sound signal and may further contain the time information of collecting the first sound signal. When the user listens to the target audio file, he/she can be aware of where the first sound signal comes from and can easily think back something. At the same time, when using the headphone, the user can know external situation through the target audio file recorded and can know outside conversation without wearing the headphone repeatedly, thereby avoiding missing important information.

At block 806, a stored audio file corresponding to the third sound signal is deleted.

When no play instruction is received, it indicates that the current recorded content is not critical and the user does not need to play the third sound signal. The stored audio file corresponding to the third sound signal is deleted to save a storage space.

It should be understood that although the various steps in the flow charts of FIGS. 3-8 are sequentially displayed as indicated by the arrows, these steps are not necessarily performed in the order indicated by the arrows. Except as explicitly stated herein, the execution of these steps is not strictly limited, and the steps may be performed in other orders. Moreover, at least some of the steps in FIGS. 3-8 may include multiple sub-steps or multiple stages, which are not necessarily performed at the same time, and can be performed at different times, the order of execution of these sub-steps or stages is not necessarily performed sequentially, and can be performed in turn or alternately with at least a part of other steps or sub-steps or stages of other steps.

Figure 9:
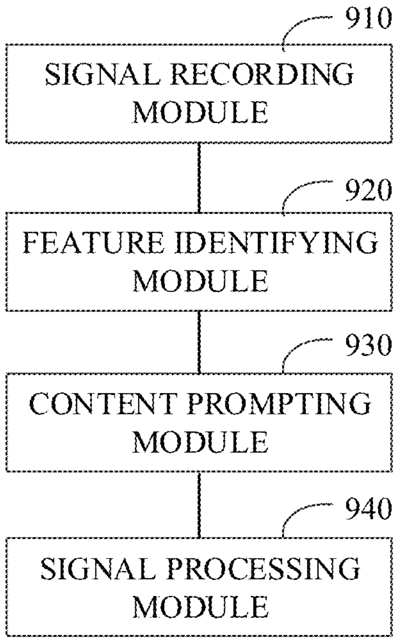
FIG. 9 is a schematic structural diagram illustrating an apparatus for processing signals according to an implementation of the present disclosure.

As illustrated in FIG. 9, an apparatus for processing signals is provided. The apparatus includes a signal recording module 910, a feature identifying module 920, a content prompting module 930, and a signal processing module 940.

The signal recording module 910 is configured to alternately record a first sound signal of external environment and a second sound signal of a talking party when a user talks through the headphone, and obtain a third sound signal of external environment, by eliminating voices in the first sound signal according to the second sound signal.

The feature identifying module 920 is configured to identify feature audio in the third sound signal of external environment and to acquire reminding information corresponding to the feature audio.

The content prompting module 930 is configured to inquire of the user whether the third sound signal of external environment is critical according to the reminding information, when the talk ends.

The signal processing module 940 is configured to detect an input operation of the user and to process the third sound signal of external environment according to the input operation of the user.

According to the apparatus for processing signals, the external environment sound can be recorded with inherent components of the headphone, headphone playing and external sound acquisition can be both taken into account, and the user can be reminded according to the recorded content so that the user will not miss important information when he or she wears the headphone, thus improving convenience of using the headphone and further enhancing use experience.

As one implementation, the signal recording module 910 is further configured to record alternately, with at least one speaker of the headphone configured to play an audio signal, the first sound signal of the external environment and the second sound signal of the talking party, when the user talks through the headphone.

As one implementation, the signal recording module 910 is further configured to record alternately, with a first microphone close to at least one speaker of the headphone, the first sound signal of the external environment and the second sound signal of the talking party.

As one implementation, the apparatus includes a noise reduction unit. The noise reduction unit is configured to perform noise reduction on a voice signal of the user collected by a second microphone of the headphone according to the first sound signal.

As one implementation, the apparatus includes a storing unit. The storing unit is configured to acquire the third sound signal of external environment that is obtained by the headphone within a preset time period; generate and storing an audio file corresponding to the third sound signal of external environment.

As one implementation, the apparatus further includes a signal detecting module. The signal detecting module is configured to detect existence of a valid sound signal in the third sound signal of external environment, and to smooth and filter the third sound signal of external environment when the valid sound signal exists.

As one implementation, the feature identifying module 920 is further configured to judge whether the third sound signal contains the feature audio according to a preset sound model, and to determine the reminding information corresponding to the feature audio according to a corresponding relationship between feature audio and reminding information, based on a judgment that the third sound signal contains the feature audio.

As one implementation, the feature identifying module 920 is further configured to at least one of: extract noise information in the third sound signal and determine whether the noise information matches a preset noise model; extract voiceprint information in the third sound signal and determine whether the voiceprint information matches a sample voiceprint information; extract sensitive information in the third sound signal and determine whether the sensitive information matches a preset keyword.

As one implementation, the signal processing module 940 is further configured to acquire the input operation of the user and to determine whether to play the third sound signal according to the input operation, and to play the third sound signal based on a determination that the first sound signal is to be played or to delete a stored audio file corresponding to the third sound signal based on a determination that the third sound signal is not to be played.

As one implementation, the signal processing module 940 is further configured to acquire geographic location information of the first sound signal by the headphone, to generate a target audio file according to the third sound signal and the geographic location information of the first sound signal, and to play the target audio file.

The division of each module in the above-mentioned apparatus for processing signals is for illustrative purposes only. In other implementations, the apparatus for processing signals may be divided into different modules as needed to complete all or part of the functions of the above-mentioned apparatus for processing signals.

For the specific definition of the apparatus for processing signals, reference may be made to the definition of the method for processing signals, and details are not described herein again. Each module in the above-described apparatus for processing signals can be implemented in whole or in part by software, hardware, and combinations thereof. Each of the above modules may be embedded in or independent of a processor in a computer device, or may be stored in a memory of the computer device in a software form, so that the processor can invoke and implement the operations corresponding to the above modules.

The implementation of each module in the apparatus for processing signals provided in the implementations of the present disclosure may be in the form of a computer program. The computer program can run on a terminal device or server. The program modules of the computer program can be stored in the memory of the terminal device or server. The computer program which, when executed by the processor, are operable to perform operations of the method for processing signals described in the implementations of the present disclosure.

Implementations of the disclosure further provide a headphone. The headphone includes an electroacoustic transducer, a memory, a processor, and computer programs stored in the memory and executed by the processor. The processor is electrically coupled with the electroacoustic transducer and the memory. The computer programs which, when executed by the processor, are operable to perform the method for processing signals provided in the above-mentioned implementations.

Implementations of the disclosure further provide a non-transitory computer readable storage medium. The non-transitory computer readable storage medium contains computer executable instructions which, when executed by one or more processors, are operable with the one or more processor to implement the method for processing signals provided in the above-mentioned implementations.

Implementations of the disclosure further provide a computer program product. The computer program product contains instructions which, when executed by a computer, are operable with the computer to implement the method for processing signals provided in the above-mentioned implementations.

Figure 10:
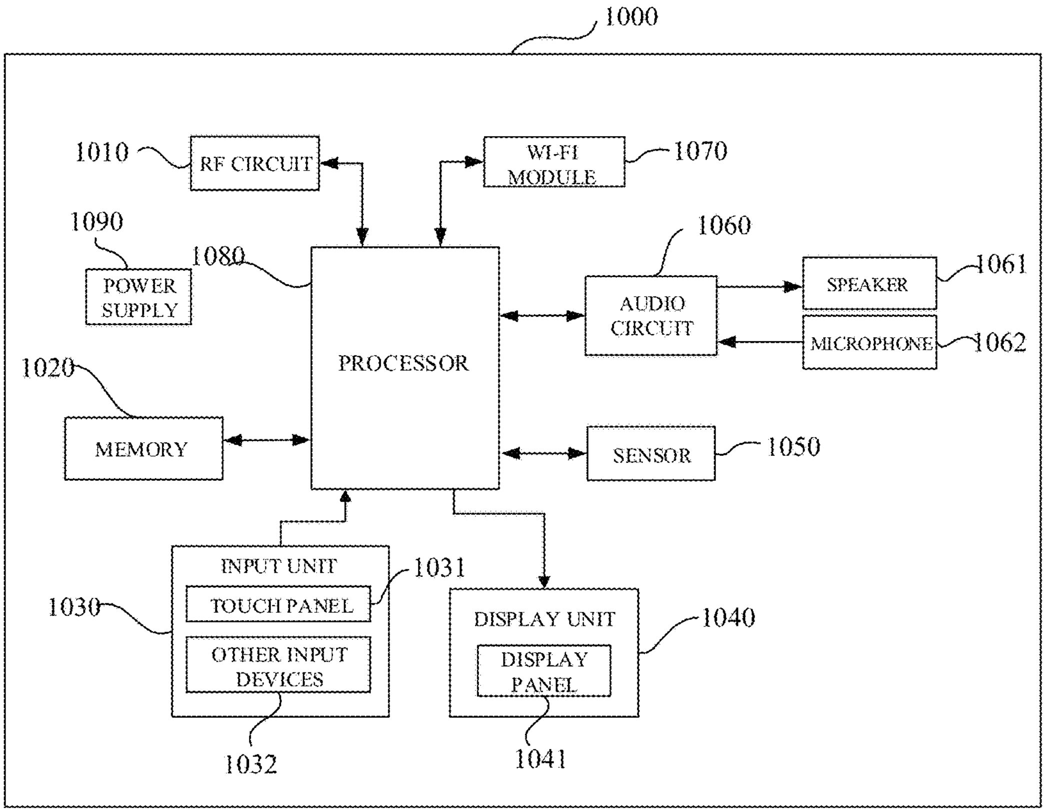
FIG. 10 is a block diagram illustrating a partial structure of a mobile phone related to a terminal device according to an implementation of the present disclosure.

Implementations of the disclosure further provide a terminal device. As illustrated in FIG. 10, only parts related to the implementations of the present disclosure are illustrated for ease of description. For technical details not described, reference may be made to the method implementations of the present disclosure. The terminal device may be any terminal device, such as a mobile phone, a tablet computer, a personal digital assistant (PDA), a point of sale terminal device (POS), an on-board computer, a wearable device, and the like. The following describes the mobile phone as an example of the terminal device.

FIG. 10 is a block diagram illustrating a partial structure of a mobile phone related to a terminal device according to an implementation of the present disclosure. As illustrated in FIG. 10, the mobile phone includes a radio frequency (RF) circuit 1010, a memory 1020, an input unit 1030, a display unit 1040, a sensor 1050, an audio circuit 1060, a wireless fidelity (Wi-Fi) module 1070, a processor 1080, a power supply 1090, and other components. Those skilled in the art can understand that the structure of the mobile phone illustrated in FIG. 10 does not constitute any limitation on the mobile phone. The mobile phone configured to implement technical solutions of the disclosure may include more or fewer components than illustrated or may combine certain components or different components.

The RF circuit 1010 is configured to receive and transmit information, or receive and transmit signals during a talk. As one implementation, the RF circuit 1010 is configured to receive downlink information of a base station, which will be processed by the processor 1080. In addition, the RF circuit 1010 is configured to transmit uplink data to the base station. Generally, the RF circuit 1010 includes, but is not limited to, an antenna, at least one amplifier, a transceiver, a coupler, a low noise amplifier (LNA), a duplexer, and the like. In addition, the RF circuit 1010 may also communicate with the network and other devices via wireless communication. The above wireless communication may use any communication standard or protocol, which includes, but is not limited to, global system of mobile communication (GSM), general packet radio service (GPRS), code division multiple access (CDMA), wideband code division multiple access (WCDMA), long term evolution (LTE), E-mail, short messaging service (SMS), and so on.

The memory 1020 is configured to store software programs and modules. The processor 1080 is configured to execute various function applications and data processing of the mobile phone by running the software programs and the modules stored in the memory 1020. The memory 1020 mainly includes a program storage area and a data storage area. The program storage area may store an operating system, applications required for at least one function (such as sound playback function, image playback function, etc.). The data storage area may store data (such as audio data, a phone book, etc.) created according to use of the mobile phone, and so on. In addition, the memory 1020 may include a high-speed RAM, and may further include a non-transitory memory such as at least one disk storage device, a flash device, or other non-transitory solid storage devices.

The input unit 1030 may be configured to receive input digital or character information and to generate key signal input associated with user setting and function control of the mobile phone 1000. As one implementation, the input unit 1030 may include a touch panel 1031 and other input devices 1032. The touch panel 1031, also known as a touch screen, is configured to collect touch operations generated by the user on or near the touch panel 1031 (such as operations generated by the user using any suitable object or accessory such as a finger or a stylus to touch the touch panel 1031 or areas near the touch panel 1031), and to drive a corresponding connection device according to a preset program. As one implementation, the touch panel 1031 may include two parts of a touch detection device and a touch controller. The touch detection device is configured to detect the user's touch orientation and a signal brought by the touch operation, and to transmit the signal to the touch controller. The touch controller is configured to receive the touch information from the touch detection device, to convert the touch information into contact coordinates, and to transmit the contact coordinates to the processor 1080 again. The touch controller can also receive and execute commands from the processor 1080. In addition, the touch panel 1031 may be implemented in various types such as resistive, capacitive, infrared, and surface acoustic waves. In addition to the touch panel 1031, the input unit 1030 may further include other input devices 1032. The input devices 1032 include, but are not limited to, one or more of a physical keyboard, function keys (such as volume control buttons, switch buttons, etc.).

The display unit 1040 is configured to display information input by the user, information provided for the user, or various menus of the mobile phone. The display unit 1040 may include a display panel 1041. As one implementation, the display panel 1041 may be in the form of a liquid crystal display (LCD), an organic light-emitting diode (OLED), and so on. The touch panel 1031 may cover the display panel 1041. After the touch panel 1031 detects a touch operation on or near the touch panel 1031, the touch panel 1031 transmits the touch operation to the processor 1080 to determine a type of the touch event, and then the processor 1080 provides a corresponding visual output on the display panel 1041 according to the type of the touch event. Although in FIG. 10, the touch panel 1031 and the display panel 1041 function as two independent components to implement input and output functions of the mobile phone, in some implementations, the touch panel 1031 and the display panel 1041 may be integrated to achieve the input and output functions of the mobile phone.

The mobile phone 1000 may also include at least one sensor 1050, such as a light sensor, a motion sensor, and other sensors. As one implementation, the light sensor may include an ambient light sensor and a proximity sensor, among which the ambient light sensor may adjust the brightness of the display panel 1041 according to ambient lights, and the proximity sensor may turn off the display panel 1041 and/or backlight when the mobile phone reaches nearby the ear. As a kind of motion sensor, an accelerometer sensor can detect magnitude of acceleration in all directions, and when the mobile phone is stationary, the accelerometer sensor can detect the magnitude and direction of gravity, which can be used for applications which requires mobile-phone gestures identification (such as vertical and horizontal screen switch), or can be used for vibration-recognition related functions (such as a pedometer, percussion), and so on. In addition, the mobile phone can also be equipped with a gyroscope, a barometer, a hygrometer, a thermometer, an infrared sensor, and other sensors.

The audio circuit 1060, a speaker 1061, and a microphone 1062 may provide an audio interface between the user and the mobile phone. The audio circuit 1060 may convert the received audio data into electrical signals and transmit the electrical signals to the speaker 1061; thereafter the speaker 1061 may convert the electrical signals into sound signals to output. On the other hand, the microphone 1062 may convert the received sound signals into electrical signals, which will be received and converted into audio data by the audio circuit 1060 to output to the processor 1080. The audio data may then be processed and transmitted by the processor 1080 via the RF circuit 1010 to another mobile phone. Alternatively, the audio data may be output to the memory 1020 for further processing.

Wi-Fi belongs to a short-range wireless transmission technology. With aid of the Wi-Fi module 1070, the mobile phone may assist the user in E-mail receiving and sending, webpage browsing, access to streaming media, and the like. Wi-Fi provides users with wireless broadband Internet access. Although the Wi-Fi module 1070 is illustrated in FIG. 10, it should be understood that the Wi-Fi module 1070 is not essential to the mobile phone 1000 and can be omitted according to actual needs.

The processor 1080 is a control center of the mobile phone. The processor 1080 connects various parts of the entire mobile phone through various interfaces and lines. By running or executing software programs and/or modules stored in the memory 1020 and calling data stored in the memory 1020, the processor 1080 can execute various functions of the mobile phone and conduct data processing, so as to monitor the mobile phone as a whole. As one implementation, the processor 1080 can include at least one processing unit. As one implementation, the processor 1080 can be integrated with an application processor and a modem processor, where the application processor is mainly configured to handle an operating system, a user interface, applications, and so on, and the modem processor is mainly configured to deal with wireless communication. It will be appreciated that the modem processor mentioned above may not be integrated into the processor 1080. For example, the processor 1080 can integrate an application processor and a baseband processor, and the baseband processor and other peripheral chips can form a modem processor. The mobile phone 1000 also includes a power supply 1090 (e.g., a battery) that supplies power to various components. For instance, the power supply 1090 may be logically connected to the processor 1080 via a power management system to enable management of charging, discharging, and power consumption through the power management system.

As one implementation, the mobile phone 1000 may include a camera, a Bluetooth module, and so on.

In the implementation of the present disclosure, computer programs stored in the memory which, when executed by the processor 1080 included in the mobile phone, are operable to implement the method for processing signals described in the implementations of the present disclosure.

When the computer programs running on the processor are executed, the external environment sound can be recorded with inherent components of the headphone, headphone playing and external sound acquisition can be both considered, and the user can be reminded according to the recorded content so that the user will not miss important information while wearing the headphone, thus improving convenience of using the headphone and enhancing use experience.

Any reference to a memory, storage, database, or other medium used herein may include non-transitory and/or transitory memories. Suitable non-transitory memories can include ROM, programmable ROM (PROM), electrically programmable ROM (EPROM), electrically erasable programmable ROM (EEPROM), or flash memory. Transitory memory can include RAM, which acts as an external cache. By way of illustration and not limitation, RAM is available in a variety of formats, such as static RAM (SRAM), dynamic RAM (DRAM), synchronous DRAM (SDRAM), double data rate SDRAM (DDR SDRAM), enhanced SDRAM (ESDRAM), synchronization link DRAM (SLDRAM), Rambus direct RAM (RDRAM), direct Rambus dynamic RAM (DRDRAM), and Rambus dynamic RAM (RDRAM).

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for processing signals, comprising:

recording alternately, with a headphone, a first sound signal of external environment and a second sound signal of a talking party when a user talks through the headphone;

obtaining a third sound signal of external environment, by eliminating voices in the first sound signal according to the second sound signal;

identifying feature audio in the third sound signal of external environment and acquiring reminding information corresponding to the feature audio;

inquiring of the user whether the third sound signal of external environment is critical according to the reminding information, when the talk ends; and detecting an input operation of the user and processing the third sound signal of external environment according to the input operation of the user.

2. The method of claim 1, wherein the recording alternately, with a headphone, a first sound signal of external environment and a second sound signal of a talking party when a user talks through the headphone comprises:

recording alternately, with at least one speaker of the headphone configured to play an audio signal, the first sound signal of the external environment and the second sound signal of the talking party, when the user talks through the headphone.

3. The method of claim 1, wherein the recording alternately, with a headphone, a first sound signal of external environment and a second sound signal of a talking party when a user talks through the headphone comprises:

recording alternately, with a first microphone close to at least one speaker of the headphone, the first sound signal of the external environment and the second sound signal of the talking party.

4. The method of claim 3, further comprising:

performing noise reduction on a voice signal of the user collected by a second microphone of the headphone according to the first sound signal.

5. The method of claim 1, further comprising:

acquiring the third sound signal of external environment that is obtained by the headphone within a preset time period; and generating and storing an audio file corresponding to the third sound signal of external environment.

6. The method of claim 1, further comprising the following prior to the identifying feature audio in the third sound signal of external environment:

detecting existence of a valid sound signal in the third sound signal of external environment; and smoothing and filtering the third sound signal of external environment when the valid sound signal exists.

7. The method of claim 1, wherein the identifying feature audio in the third sound signal of external environment and acquiring reminding information corresponding to the feature audio comprises:

judging whether the third sound signal contains the feature audio according to a preset sound model; and determining reminding information corresponding to the feature audio according to a corresponding relationship between feature audio and reminding information, based on a judgment that the third sound signal contains the feature audio.

8. The method of claim 7, wherein the judging whether the third sound signal contains the feature audio according to a preset sound model comprises at least one of:

extracting noise information in the third sound signal and determining whether the noise information matches a preset noise model;

extracting voiceprint information in the third sound signal and determining whether the voiceprint information matches a sample voiceprint information; and extracting sensitive information in the third sound signal and determining whether the sensitive information matches a preset keyword.

9. The method of claim 1, wherein the detecting an input operation of the user and processing the third sound signal of external environment according to the input operation of the user comprises:

acquiring the input operation of the user and determining whether to play the third sound signal according to the input operation; and playing the third sound signal based on a determination that the third sound signal is to be played; or deleting a stored audio file corresponding to the third sound signal based on a determination that the third sound signal is not to be played.

10. The method of claim 9, wherein the method further comprises:

acquiring, by the headphone, geographic location information of the first sound signal; and the playing the third sound signal comprises:

generating a target audio file according to the third sound signal and the geographic location information of the first sound signal, and playing the target audio file.

11. A terminal device, comprising:

at least one processor; and a computer readable storage, coupled to the at least one processor and storing at least one computer executable instruction thereon which, when executed by the at least one processor, cause the at least one processor to carry out actions, comprising:

recording alternately a first sound signal of external environment and a second sound signal of a talking party when a user talks through a headphone;

obtaining a third sound signal of external environment, by eliminating voices in the first sound signal according to the second sound signal;

identifying feature audio in the third sound signal of external environment and acquiring reminding information corresponding to the feature audio;

inquiring of the user whether the third sound signal of external environment is critical according to the reminding information, when the talk ends; and detecting an input operation of the user and processing the third sound signal of external environment according to the input operation of the user.

12. The terminal device of claim 11, wherein the at least one processor is further caused to carry out actions, comprising:

acquiring the third sound signal of external environment that is obtained by the headphone within a preset time period; and generating and storing an audio file corresponding to the third sound signal of external environment.

13. The terminal device of claim 11, wherein the at least one processor is further caused to carry out actions, comprising:

detecting existence of a valid sound signal in the third sound signal of external environment; and smoothing and filtering the third sound signal of external environment when the valid sound signal exists.

14. The terminal device of claim 11, wherein the at least one processor carrying out the action of identifying the feature audio in the third sound signal of external environment and acquiring the reminding information corresponding to the feature audio is caused to carry out actions, comprising:

judging whether the third sound signal contains the feature audio according to a preset sound model; and determining reminding information corresponding to the feature audio according to a corresponding relationship between feature audio and reminding information, based on a judgment that the third sound signal contains the feature audio.

15. The terminal device of claim 14, wherein the at least one processor carrying out the action of judging whether the third sound signal contains the feature audio according to the preset sound mode is caused to carry out actions, comprising at least one of:

extracting noise information in the third sound signal and determining whether the noise information matches a preset noise model;

extracting voiceprint information in the third sound signal and determining whether the voiceprint information matches a sample voiceprint information; and extracting sensitive information in the third sound signal and determining whether the sensitive information matches a preset keyword.

16. The terminal device of claim 11, wherein the at least one processor carrying out the action of detecting the input operation of the user and processing the third sound signal of external environment according to the input operation of the user is caused to carry out actions, comprising at least one of:

acquiring the input operation of the user and determining whether to play the third sound signal according to the input operation; and playing the third sound signal based on a determination that the third sound signal is to be played; or deleting a stored audio file corresponding to the third sound signal based on a determination that the third sound signal is not to be played.

17. The terminal device of claim 16, wherein the at least one processor is further caused to carry out actions, comprising:

acquiring, by the headphone, geographic location information of the first sound signal; and the at least one processor carrying out the action of playing the third sound signal is caused to carry out actions, comprising:

generating a target audio file according to the third sound signal and the geographic location information of the first sound signal, and playing the target audio file.

18. A non-transitory computer-readable storage medium storing a computer program which, when executed by a processor, causes the processor to carry out actions, comprising:

recording alternately a first sound signal of external environment and a second sound signal of a talking party when a user talks through a headphone;

obtaining a third sound signal of external environment, by eliminating voices in the first sound signal according to the second sound signal;

identifying feature audio in the third sound signal of external environment and acquiring reminding information corresponding to the feature audio;

inquiring of the user whether the third sound signal of external environment is critical according to the reminding information, when a talk ends; and detecting an input operation of the user and processing the third sound signal of external environment according to the input operation of the user.

19. The non-transitory computer-readable storage medium of claim 18, wherein the computer program which, when executed by the processor, further causes the processor to carry out actions, comprising:

detecting existence of a valid sound signal in the third sound signal of external environment; and smoothing and filtering the third sound signal of external environment when the valid sound signal exists.

20. The non-transitory computer-readable storage medium of claim 18, wherein the computer program which, when executed by the processor, causing the processor to carry out actions of identifying the feature audio in the third sound signal of external environment and acquiring the reminding information corresponding to the feature audio, further causes the processor to carry out actions, comprising:

judging whether the third sound signal contains the feature audio according to a preset sound model; and determining reminding information corresponding to the feature audio according to a corresponding relationship between feature audio and reminding information, based on a judgment that the third sound signal contains the feature audio.

* * * * *